United States Patent
Jensen et al.

(10) Patent No.: US 6,272,005 B1
(45) Date of Patent: Aug. 7, 2001

(54) APPARATUS FOR REMOVABLY MOUNTING A SYSTEM COMPONENT IN A COMPUTER

(75) Inventors: Ralph W. Jensen; Steve Sands, both of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/450,089

(22) Filed: Nov. 29, 1999

(51) Int. Cl.⁷ .................................................. H01G 7/00
(52) U.S. Cl. ..................... 361/680; 361/725; 361/726; 361/727; 312/223.1; 364/708.1; 369/75.1
(58) Field of Search ..................... 361/680–687, 361/692–697, 723–728, 610, 730–732, 733, 740, 747, 754; 369/75.1, 75.2, 292; 360/86, 97.01, 98, 99, 137; 312/332.1, 221, 333, 348.6, 214–220, 111, 223.1, 223.2, 223.3; 439/59, 157, 911, 928.1, 150; 345/169, 905; 248/417; 70/208, 225; 292/145, 175, 163–166, 336.3; 364/708.1; 174/54, 59, 60

(56) References Cited

U.S. PATENT DOCUMENTS

| | | | |
|---|---|---|---|
| 2,609,268 | * 9/1952 | Nye ........................................ | 312/320 |
| 5,010,426 | * 4/1991 | Krenz .................................... | 360/97.01 |
| 5,321,962 | 6/1994 | Ferchau et al. . | |
| 5,325,263 | 6/1994 | Singer et al. . | |
| 5,586,003 | * 12/1996 | Schmitt et al. ....................... | 361/683 |
| 5,761,045 | 6/1998 | Olson et al. . | |
| 5,777,848 | 7/1998 | McAnally et al. . | |
| 5,790,372 | 8/1998 | Dewey et al. . | |
| 5,791,753 | * 8/1998 | Paquin ............................... | 312/332.1 |
| 5,797,667 | * 8/1998 | Wu ..................................... | 312/332.1 |
| 5,805,420 | * 9/1998 | Burke .................................... | 361/727 |
| 5,949,652 | * 9/1999 | McAnally et al. .................... | 361/726 |
| 5,959,841 | * 9/1999 | Allen et al. .......................... | 361/725 |
| 6,040,981 | * 3/2000 | Schmitt et al. ....................... | 361/695 |
| 6,088,222 | * 7/2000 | Schmitt et al. ....................... | 361/686 |
| 6,134,115 | * 10/2000 | Sim et al. ............................. | 361/747 |
| 6,137,684 | * 10/2000 | Ayd et al. ............................. | 361/727 |
| 6,178,086 | * 1/2001 | Sim et al. ............................. | 361/683 |

FOREIGN PATENT DOCUMENTS

406168062-A * 6/1994 (JP) ................................ G06F/03/00

* cited by examiner

Primary Examiner—Leo P. Picard
Assistant Examiner—Michael Datskovsky
(74) Attorney, Agent, or Firm—Haynes and Boone, L.L.P.

(57) ABSTRACT

An apparatus including a main chassis and a system component chassis removably mounted in the main chassis through an opening in a top portion thereof. A positioning member is attached to the system component chassis. A handle is pivotally attached adjacent to an end wall of the main chassis for being moved between a first position and a second position. The handle includes a portion engaged by the positioning member to position the system component chassis in a docking position with respect to the main chassis when the system component chassis is mounted in the main chassis with the handle in the first position. An insertion member is attached to the handle for engaging a portion of the power supply chassis for movement thereof from the docking position to a docked position when the handle is moved from the first position to the second position. System components such as a power supply may be quickly and reliably mounted in and removed from a low profile chassis of a computer using a vertical drop-in, horizontal movement mounting technique.

20 Claims, 8 Drawing Sheets

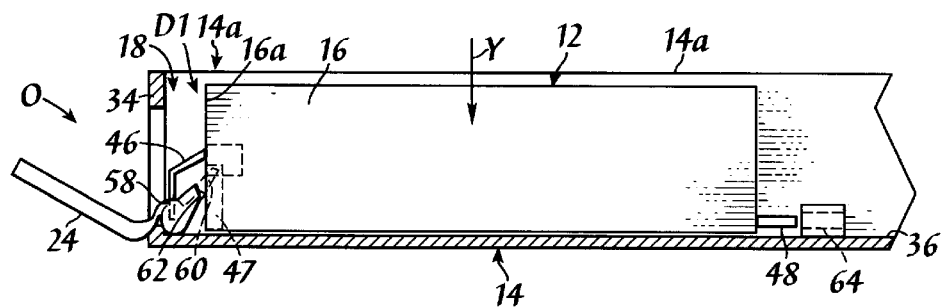
*Fig. 8*A
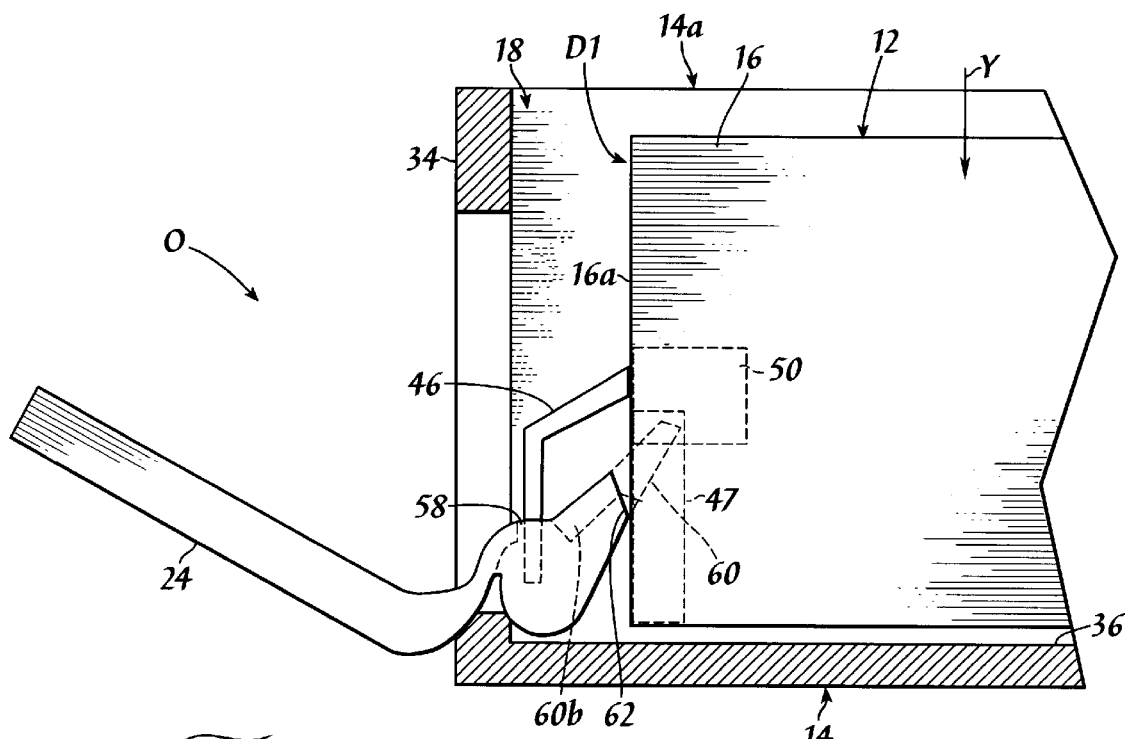
*Fig. 8*B

APPARATUS FOR REMOVABLY MOUNTING A SYSTEM COMPONENT IN A COMPUTER

BACKGROUND

The disclosures herein relate generally to computer systems and more particularly to an apparatus for removably mounting a system component in a computer.

Some computer system components such as a power supply are removably mounted in a chassis of the computer using a conventional horizontal-movement mounting technique. This type of mounting technique typically requires adequate structural space on a back wall of the chassis. The structural space is necessary for various components and features of the computer such as camming surfaces, electromagnetic interference (EMI) gaskets, parts location, etc. This type of mounting configuration also requires an overall structural rigidity for suspending the width of the system component between opposing rack slide mounts without exhibiting excessive bowing due to the weight of the system component.

U.S. Pat. No. 5,790,372 discloses a computer or other similar type of electronic device including a chassis and a power supply mounted in the chassis. One or more hooks are provided on one of the walls of the chassis and one or more corresponding walls of the power supply. The power supply is placed in the chassis and moved relative to the chassis to engage the hooks and secure the power supply in the chassis against movement in a first plane. A single screw is provided for engaging the chassis and the power supply to secure the power supply against movement in a plane perpendicular to the first plane.

U.S. Pat. No. 5,761,045 discloses a floating-plate connector assembly which includes a mounting plate. A combined power and signal pin connector, an alternating current connector and a pair of guide pins are attached to the mounting plate. The mounting plate is mounted on the rear panel of a power supply module so that the connector plate moves within predetermined limits in two axes. The floating-plate connector assembly blind mates with a printed circuit board located within a power supply chassis. A power supply system having means for securing power supply modules to the chassis that includes a handle which is pivotably connected to the power supply is also disclosed. The handle includes a cam and teeth which respectively engage a notch and apertures located on the base of the chassis when rotated in a first direction. The power supply module is disengaged from the chassis when the handle is rotated in a second direction opposite to the first direction.

U.S. Pat. No. 5,325,263 discloses a device for installing and removing a removable computer component such as a data storage drive or computer card into or out of a computer housing. The device includes a drive sled to which the removable component is mounted. A stationary carrier tray is secured to the computer housing. Interlocking angled tracks on the drive sled and the carrier tray secure the two structures together. To promote coupling of the drive's electrical interface connectors, the front end of the drive sled has a floating guide plate with forward-projecting locating pins. The pins are used to align the electrical connectors held by the floating guide plate. A rack is disposed on the top of the carrier tray while the pinion is located on the underside of the drive sled. As the drive sled slides onto the carrier tray, the lever-actuated pinion gear engages the rack and consequently displaces the drive sled relative to the stationary carrier tray. A torsion spring may be used to bias the pinion. The carrier tray also features a raised wedge that latches the lever at one extreme position when the drive sled is in its forward-most position to lock the data storage drive inside the computer housing.

For inserting and extracting hot-pluggable power supplies in the chassis of a computer, a horizontal movement mounting technique often uses a lever which is attached to the removable component power supplies. The lever is configured to move the power supply in and out of the respective portion of the chassis. The connectors that electrically connect the power supply to the related portion of the computer are often positioned in the chassis under the power supply.

In computer having a chassis with a low profile, a horizontal mounting technique for system components such as a power supply is often not practical. In some cases, the height of the chassis is only slightly greater than the height of the system component. Due to the low profile, space is limited between the system component and the chassis. Furthermore, the limited space complicates previous vertical drop-in mounting techniques, especially when the connector that connects the power supply to the mating connector of the computer is positioned under the system component.

Accordingly, what is needed is an apparatus for removably mounting a system component in the low profile chassis of a computer using a vertical drop-in, horizontal movement mounting technique that overcomes the shortcomings associated with previous mounting techniques.

SUMMARY

One embodiment, accordingly, provides an apparatus for removably mounting a system component in a low profile chassis through an opening in a top portion of the chassis and moves the system component into a docked position through a horizontal movement. To this end, an apparatus includes a main chassis and a system component chassis that is removably mountable in the main chassis through an opening in a top portion of the main chassis. The system component chassis has a channel formed therein. A positioning member is attached to the system component chassis. A handle is pivotally attached to an end portion of the main chassis for being moved between a first position and a second position. The handle includes a first portion receiving the positioning member and a second portion positioned in the channel for moving the component chassis from a docking position to a docked position when the handle is moved from the first position to the second position. An extraction member engages the positioning member from moving the component chassis from the docked position to the docking position when the handle is moved from the second position to the first position.

A principal advantage of this embodiment is that system components may be quickly and reliably mounted in a low profile chassis of a computer using a mounting apparatus that is simple to operate and inexpensive to manufacture.

BRIEF DESCRIPTION OF THE DRAWINGS FIGURES

FIGS. 8A and 8B are diagrammatic views illustrating an embodiment of the system component in a docking position with respect to the main chassis.

DETAILED DESCRIPTION

Figure 1:
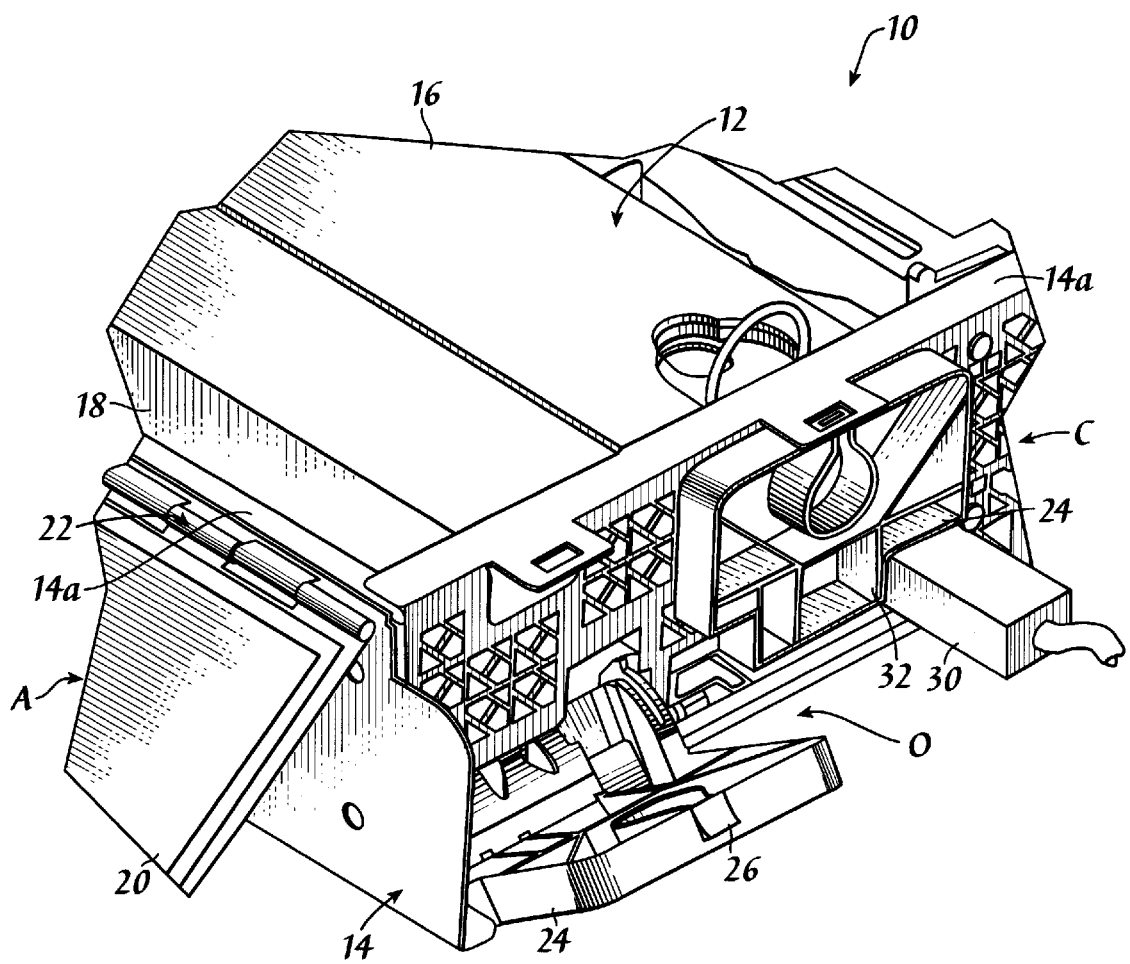
FIG. 1 is a perspective view illustrating an embodiment of an apparatus for mounting a system component in a chassis.

An embodiment of an apparatus 10 for removably mounting at least one system component 12 such as a power supply in a computer is illustrated in FIG. 1. The apparatus 10 includes a main chassis 14 and at least one system component chassis 16 removably mounted in the main chassis 14. Each system component chassis 16 is mounted in the main chassis 14 in a top-down manner through an opening 18 defined by a top portion 14a of the main chassis 14.

A cover 20, FIG. 1, is attached to the main chassis 14 by a hinge 22. The cover 20 may be moved between an open position A and a closed position (not shown). In the closed position, the cover 20 rests flush with the top portion 14a of the main chassis 14.

Still referring to FIG. 1, a handle 24 is pivotally attached to the main chassis 14 adjacent to each system component chassis 16. Each handle 24 is movable between an open position O and a closed position C. Each handle 24 includes a latch portion 26. A catch portion 28 corresponding to each handle 24 is attached to the main chassis 14. Each catch portion 28 includes a flange 28a and an opening 28b extending through the flange 28a. The opening 28b defines an edge 28c. Each latch portion 26 releasably engages the edge 28c of the opening 28b of the corresponding catch portion 28 for securing the respective handle 24 in the closed position C. A plug 30, such as the plug of a power cable, passes through a plug passage 32 in the handle 24. The main chassis 14 and the system component chassis 16 may be made from sheet metal using known processes such as stamping and metal forming.

Figure 2:
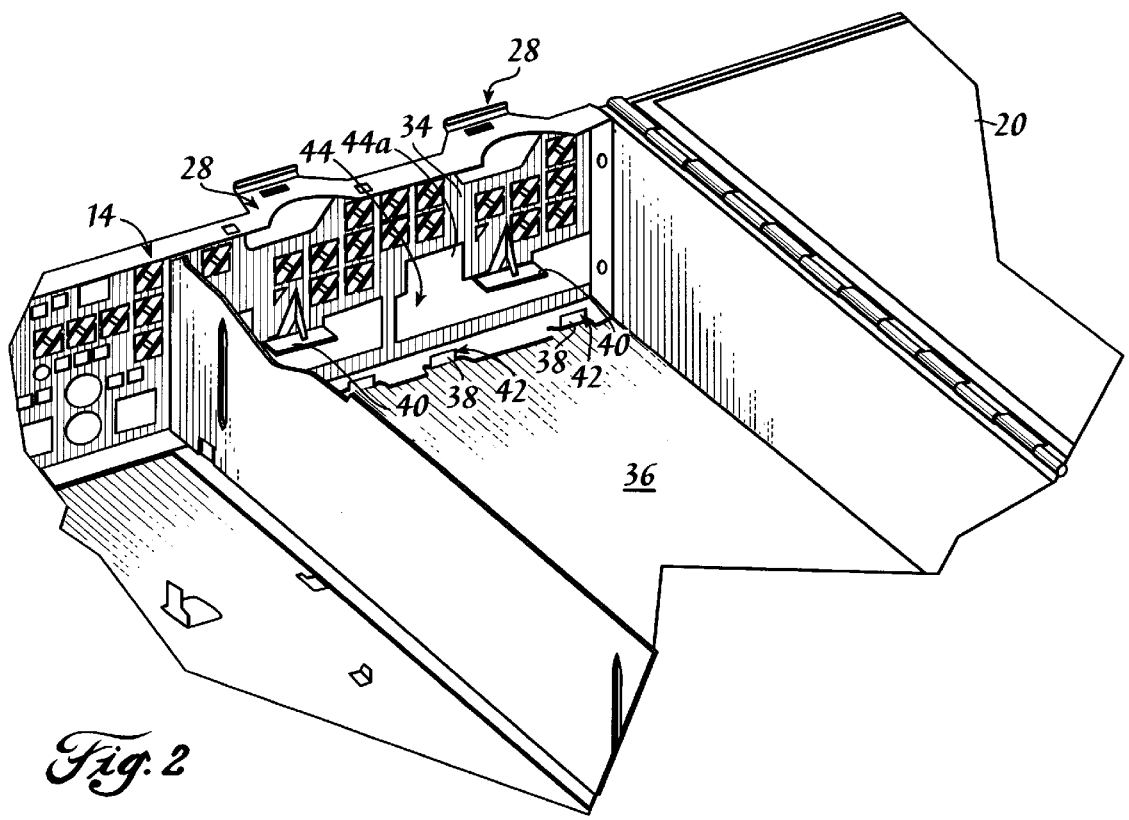
FIG. 2 is a perspective view illustrating an embodiment of an interior portion of a main chassis.
Figure 3:
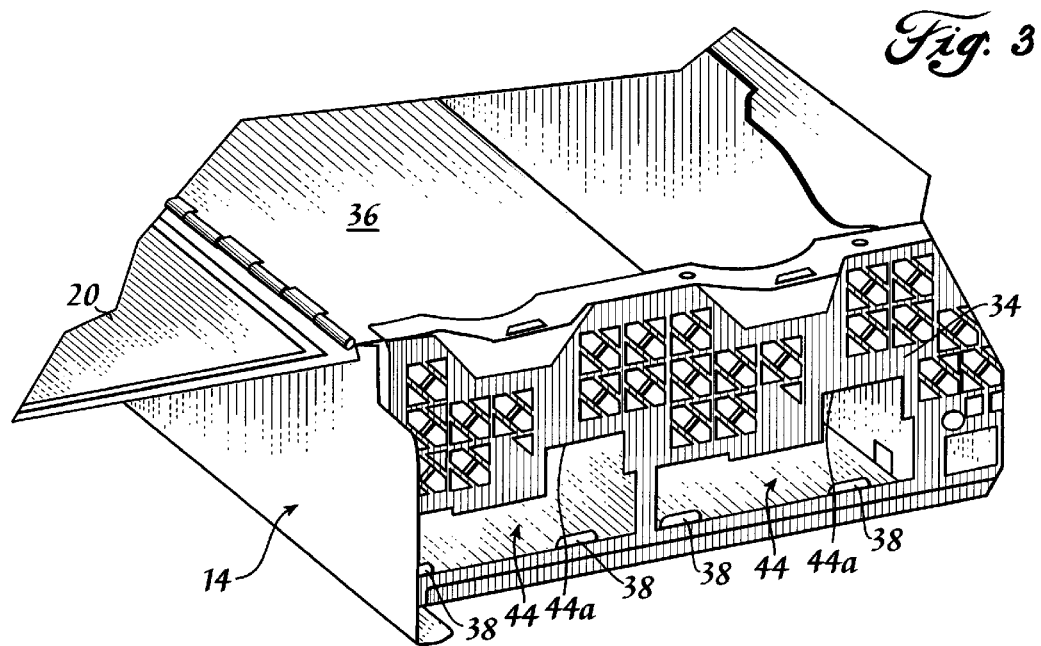
FIG. 3 is a perspective view illustrating an embodiment of an end wall of the main chassis.

Referring now to FIGS. 2 and 3, the main chassis 14 includes an end wall 34 and a base wall 36. A plurality of first flanges 38 extend from the base wall 36 in a direction generally perpendicular to the base wall 36. At least one second flange 40 extends from the end wall 34 in a direction generally perpendicular to the end wall 34. The end wall 34, base wall 36, and each one of the first flanges 38 define a corresponding channel 42. One or more handle openings 44 are formed in the end wall 34. Each handle opening 44 includes a plug region 44a for permitting the plug 30, illustrated in FIG. 1, to pass through the end wall 34.

Figure 4:
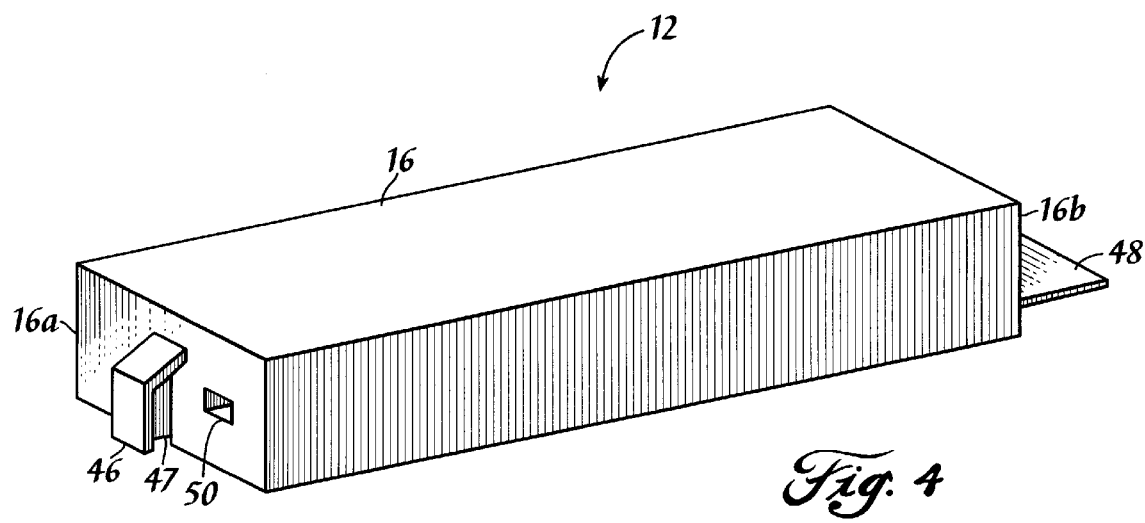
FIG. 4 is a perspective view diagrammatically illustrating an embodiment of a system component.

An embodiment of the system component 12 is illustrated in FIG. 4. The system component 12 includes a positioning member 46 attached to a first end 16a of the system component chassis 16. A channel 47 is formed in the system component chassis 16 adjacent to the positioning member 46. A card edge 48 extends from a second end 16b of the system component chassis 16. A plug connector 50 is positioned adjacent to the first end 16a of the system component chassis 16 for receiving the plug 30, illustrated in FIG. 1.

Figure 5:
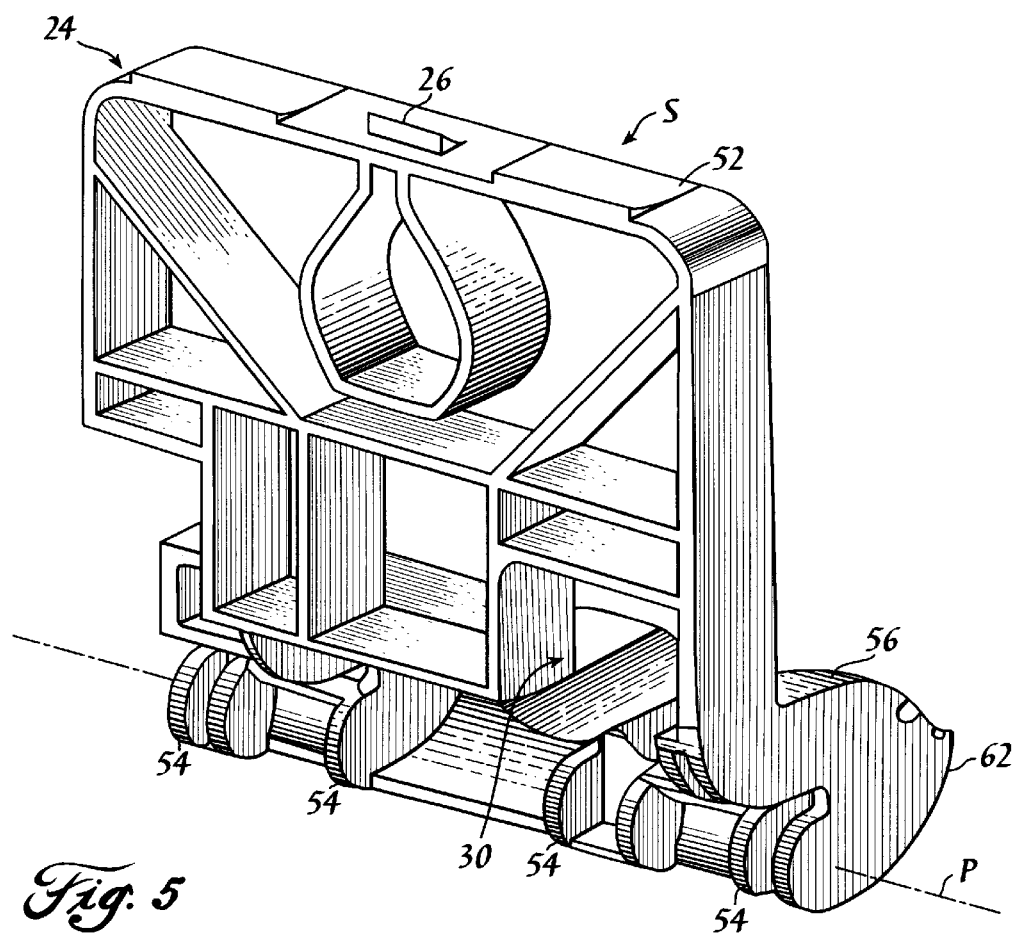
FIG. 5 is a perspective view illustrating an embodiment of a first side of a handle.
Figure 6:
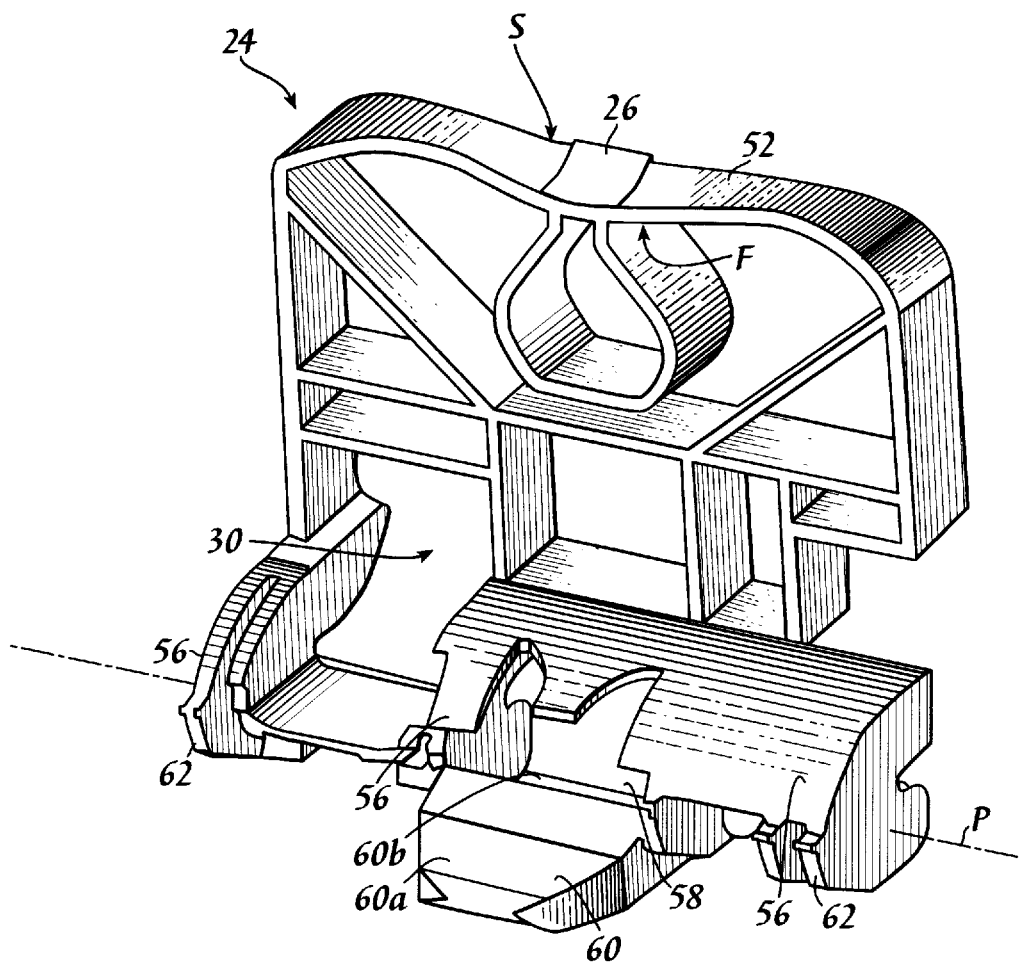
FIG. 6 is a perspective view illustrating an embodiment of a second side of the handle.

An embodiment of the handle 24 is illustrated in FIGS. 5 and 6. The latch portion 26 is attached to a flexible member 52. The flexible member 52 may be moved between a static position S, FIG. 5, and a flexed position F, FIG. 6. The latch portion 26 disengages from the catch portion 28, illustrated in FIG. 1, when the flexible member 52 is moved to the flexed position F, FIG. 6. With the plug 30 removed from the power supply 12, the handle 24 may be moved from the closed position C to the open position O (see FIG. 1).

Still referring to FIGS. 5 and 6, the handle 24 includes a plurality of first bearing portions 54 and a plurality of second bearing portions 56. The first and second bearing portions 54, 56 have a semi-cylindrical profile and are concentric about a pivot axis P. The handle 24 includes a receptacle 58 and a protruding member 60 adjacent to the receptacle 58. The protruding member 60 includes a tapered end 60a and an extraction member 60b adjacent to the receptacle 58. A plurality of insertion members 62 are attached to the handle 24 adjacent to the second bearing portions 56. The handle 24 and the components attached to the handle 24 may be formed from a material such as polycarbonate using a process such as injection molding.

Figure 7:
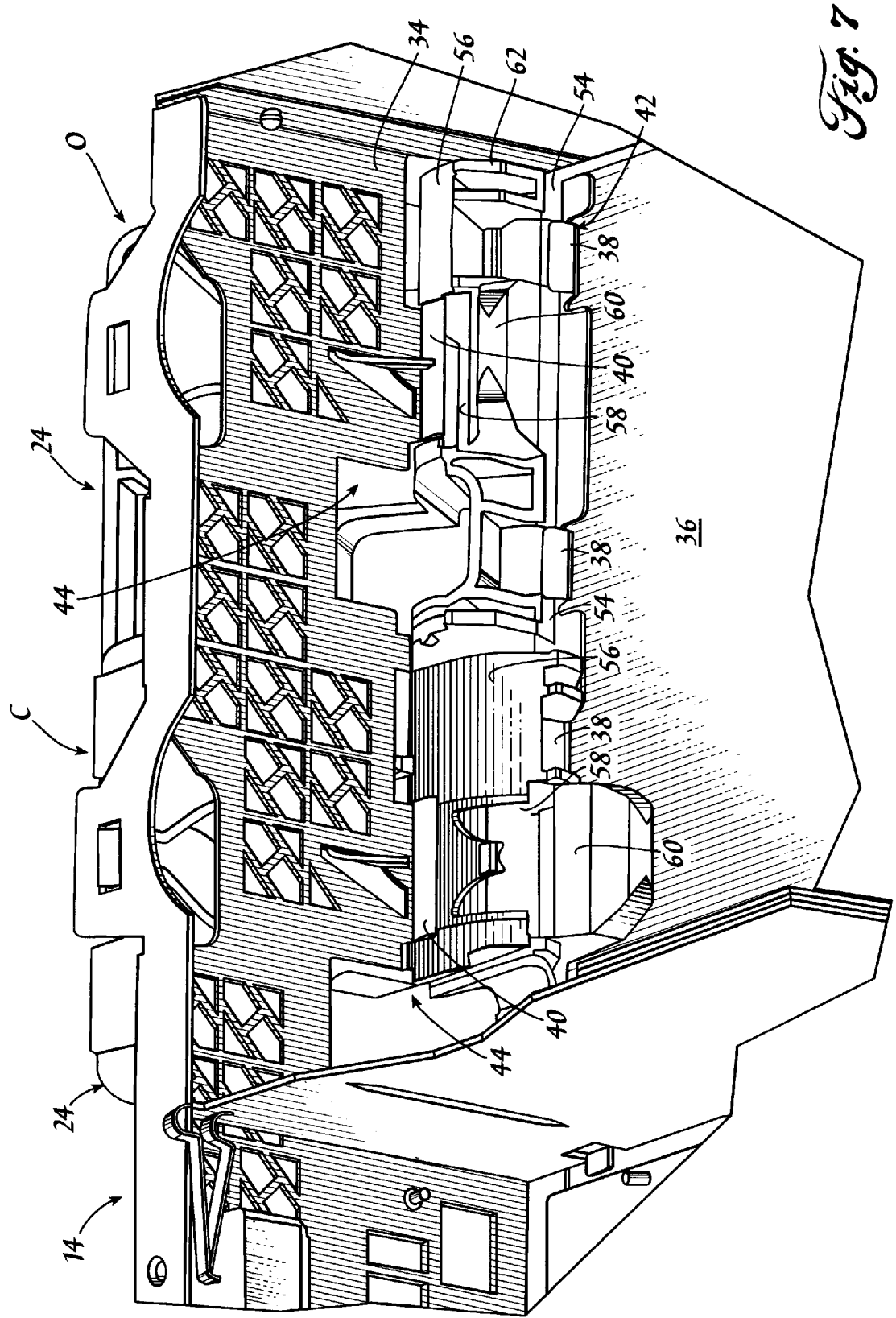
FIG. 7 is a perspective view illustrating the handle mounted in the main chassis.

Referring now to FIG. 7, a handle 24 is mounted in each handle opening 44. The first bearing portions 54 of each handle 24 are seated in a respective channel 42. The second bearing portions 56 of each one of the handles 24 are seated against a respective second flange 40. When the handle 24 is in the open position O, the receptacle 58 is positioned adjacent to the second flange 40. When the handle 24 is in the closed position C, the receptacle 58 is moved away from the second flange 40 toward the base wall 36 of the main chassis 14.

As illustrated in FIGS. 8A and 8B, the system component 12 is mounted in the main chassis 14 along a first direction Y through the opening 18 in the top portion 14a of the main chassis 14. The first direction Y is generally perpendicular to the base wall 36. When mounted with the handle 24 in the open position O, the system component 12 is positioned in a docking position D1 with the positioning member 46 seated in the receptacle 58 and the protruding member 60 positioned in the channel 47. The protruding member 60 is configured to engage the channel 47 for aiding in the alignment of the system component 12 with respect to the main chassis 14.

Figure 9A:
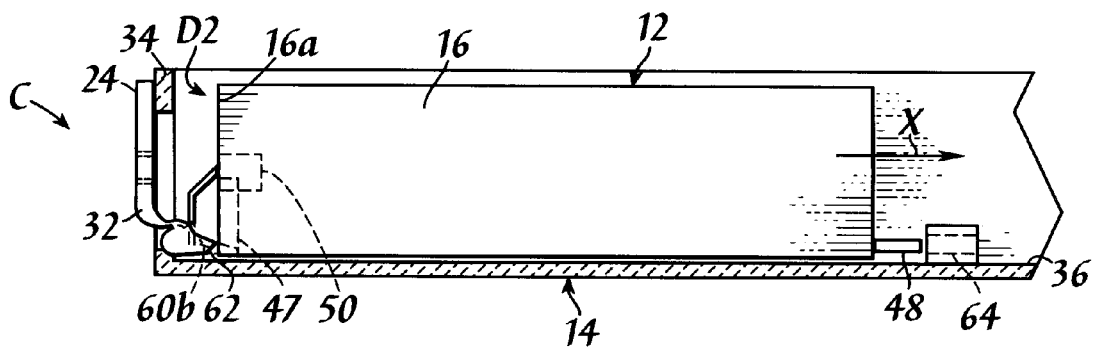
FIGS. 9A and 9B are diagrammatic views illustrating an embodiment of the system component in a docked position with respect to the main chassis.
Figure 9B:
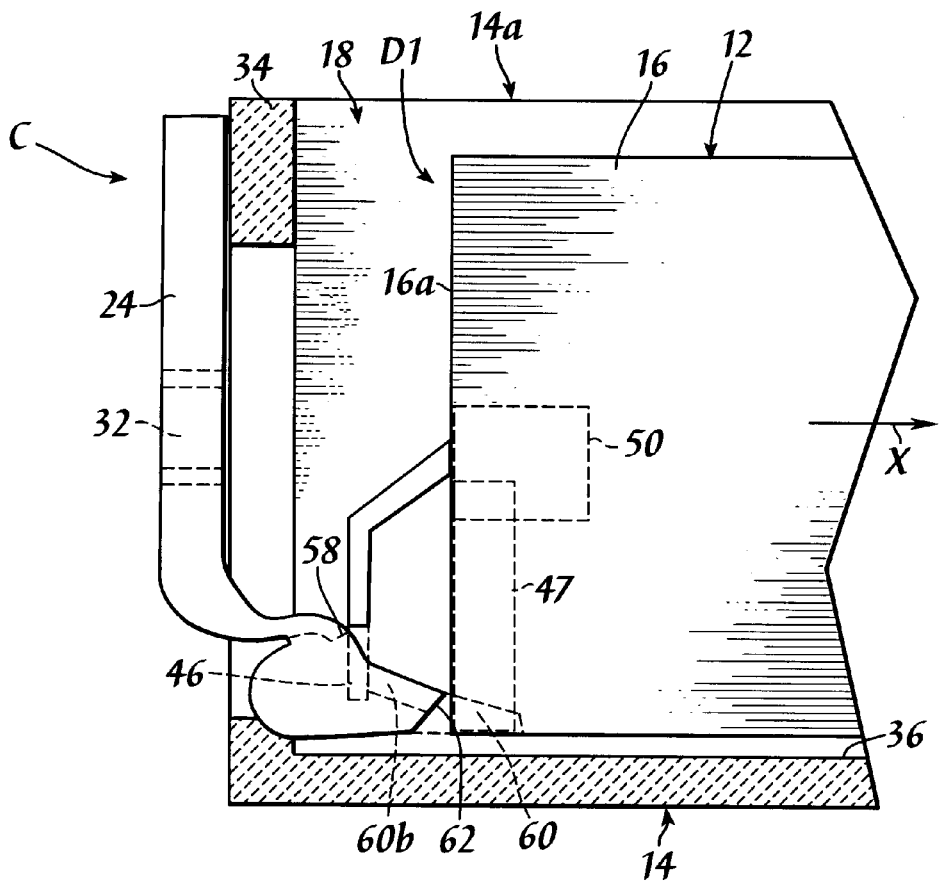

When the system component 12 is in the docking position D1, FIGS. 8A and 8B, and the handle 24 is moved to the closed position C, FIGS. 9A and 9B, the insertion members 62 engage the first end 16a of the system component chassis 16 for moving the system component 12 along a second direction X to a docked position D2. The second direction X is generally perpendicular to the end wall 34. In the docked position D2, the card edge 48, FIG. 9A, is engaged with a connector 64. As a result of the system component 12 being moved from the docking position D1 to the docked position D2, the plug passage 32 in the handle 24 is aligned with the plug connector 50 of the system component 12, FIGS. 9A and 9B.

The system component 12 is moved from the docked position D2 to the docking position D1 by moving the handle 24 from the closed position C to the open position O. When the handle 24 is moved from the closed position C to the open position O, the extraction member 60b, FIG. 9B, engages the positioning member 46 to move the system component 12 from the docked position D2 to the docking position D1, FIG. 8B. Once in the docking position D1, the system component 12 can be removed from the main chassis 14.

Figure 10:
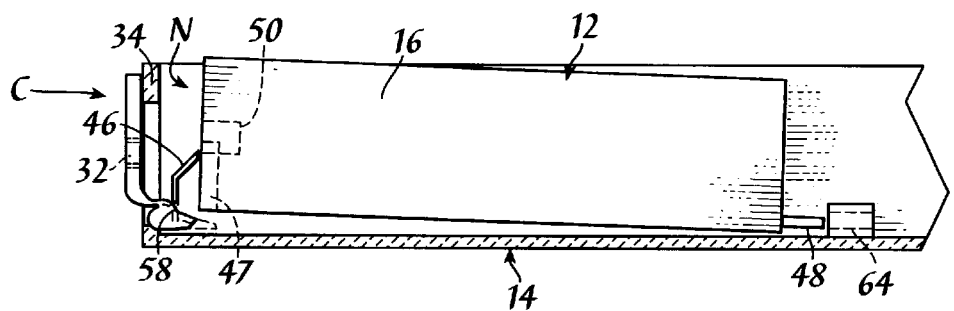
FIG. 10 is a diagrammatic view illustrating an embodiment of the system component in a non-dockable position with respect to the main chassis.

In the event that the system component 12 is mounted in the main chassis 14 and the handle 24 is in the closed position C, the system component 12 could not be docked. For example, as illustrated in FIG. 10, the system component 12 is positioned in a non-dockable position N when the system component 12 is mounted in the main chassis 14 with the handle 24 in the closed position C. The positioning member 46 does not engage the receptacle 58 when the system component 12 is mounted in the main chassis 14 with the handle 24 in the closed position C. As a result, the positioning member 46 engages an alternate portion of the handle 24 such that the system component 12 is positioned in the non-dockable position N. In the non-dockable position N, the plug passage 32 in the handle 24 is misaligned with the plug connector 50 of the system component 12, preventing the plug 30, described above in reference to FIG. 1, from being connected with the plug connector 50. Therefore, in order for the system component 12 to be docked, the handle 24 must be in the open position O when the system component 12 is mounted in main chassis 14.

Figure 11:
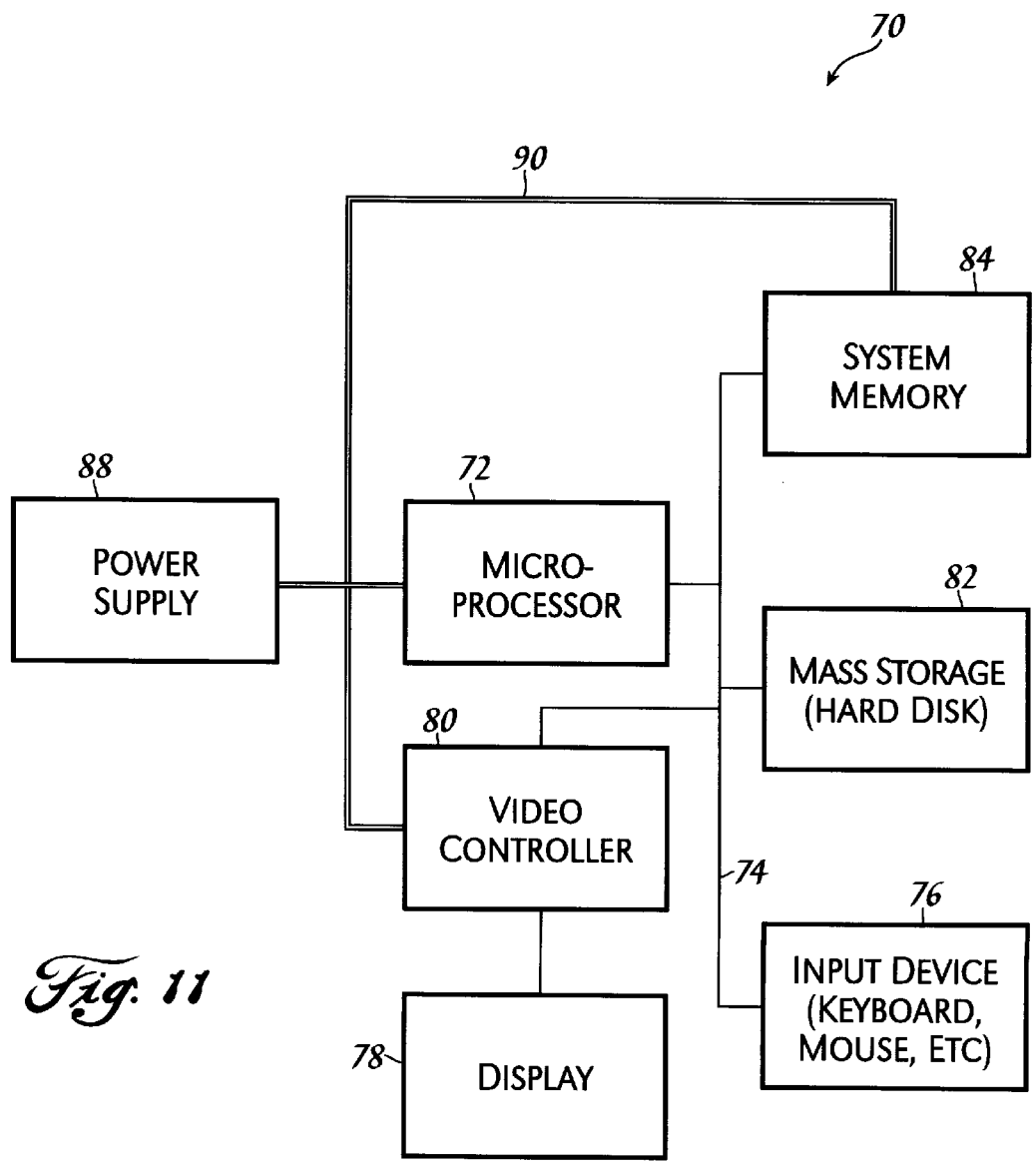
FIG. 11 is a block diagram illustrating an embodiment of a computer system.

An embodiment of a computer system 70 is illustrated in FIG. 11. The computer system 70 includes at least one microprocessor 72. The microprocessor 72 is connected to a signal bus 74. The signal bus 74 serves as a connection between the microprocessor 72 and other components of the computer system 70. One or more input devices 76 may be coupled to the microprocessor 72 to provide input to the microprocessor 72. Examples of input devices include keyboards, touchscreens, and pointing devices such as a mouse, a trackball and a trackpad. The computer system 70 may also include a display 78 which is typically coupled to the microprocessor 72 by a video controller 80. Programs and data are stored on a mass storage device 82 which is coupled to the microprocessor 72. Mass storage devices include components such as hard disks, optical disks, magneto-optical drives, floppy drives, and the like. A system memory 84 is coupled to the microprocessor 72 for providing the microprocessor 72 with fast storage to facilitate execution of computer programs by the microprocessor 72. It should be understood that other busses and intermediate circuits can be employed between the components described above and microprocessor 72 to facilitate interconnection between the components and the microprocessor 72.

The computer system 70, FIG. 11, may include a power supply 88. The power supply 88 is electrically connected through a power bus 90 to provide regulated power to at least the microprocessor 72, the system memory 84 and the video controller 80. The various components of the power supply 88 are mounted in a chassis such as the system component chassis 16, FIG. 4, and the various system components comprising the computer system 70, including the power supply 88, are typically mounted in a chassis such as the main chassis 14, FIG. 1.

As it can be seen, the embodiments presented herein provide several advantages. The apparatus provides a vertical drop-in, horizontal movement docking technique for hot-plugging system components that are mountable in a low profile main chassis. The latching mechanism is relatively simple and avoids premature connection to an AC power source. Separate fasteners are not required to secure the handle to the main chassis. The handle uses a pin-less pivoting operation. The system component can only be moved from the docking position to the docked position through the use of the handle.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for removably mounting a system component in a computer, comprising:
   a main chassis;
   a system component chassis removably mounted in the main chassis through an opening in a top portion thereof, the system component chassis having a channel formed therein;
   a positioning member attached to the system component chassis;
   a handle pivotally attached to the main chassis adjacent to an end wall for being moved between a first position and a second position, the handle having a first portion for receiving the positioning member and having a second portion positioned in the channel for moving the component chassis from a docking position to a docked position when the handle is moved from the first position to the second position; and
   an extraction member engaging the positioning member for moving the component chassis from the docked position to the docking position when the handle is moved from the second position to the first position.

2. The apparatus of claim 1 wherein the first portion of the handle includes a receptacle for receiving the positioning member.

3. The apparatus of claim 2 wherein the extraction member is attached to the handle.

4. The apparatus of claim 1 wherein the system component chassis is displaced along an axis extending generally perpendicular to the end wall of the main chassis when the handle is moved from the first position toward the second position.

5. The apparatus of claim 1 wherein the second portion of the handle includes a protruding member extending from the handle.

6. The apparatus of claim 1 wherein the handle includes a plug passage extending therethrough and wherein the system component chassis includes a plug connector mounted therein.

7. The apparatus of claim 6 wherein the plug passage is generally aligned with the plug connector passage when the system component is in the docked position.

8. The apparatus of claim 1 wherein the handle includes a latch portion for securing the handle in the second position, the latch portion releasably engaging a catch portion of the main chassis when the handle is moved to the second position.

9. The apparatus of claim 1 wherein the main chassis includes a base wall, a first flange extending from the base wall in a direction generally perpendicular to the base wall and a second flange extending from the end wall in a direction generally perpendicular to the end wall, and wherein the handle includes a plurality of concentric semi-cylindrical bearing portions, a first one of the bearing portions being seated in a channel defined by the base wall, the end wall and the first flange, and a second one of the bearing portions engaged against the second flange.

10. A computer system, comprising:

a main chassis;

a microprocessor mounted in the main chassis;

an input coupled to the microprocessor to provide input to the microprocessor;

a mass storage device coupled to the microprocessor;

memory coupled to the microprocessor to provide storage to facilitate execution of computer programs by the microprocessor;

a display coupled to the microprocessor by a video controller;

a power supply removably mounted in the main chassis through an opening in a top portion thereof, the power supply including a power supply chassis having a channel formed therein;

a positioning member attached to the power supply chassis;

a handle pivotally attached to the main chassis adjacent to an end wall for being moved between a first position and a second position, the handle having a first portion for receiving the positioning member and having a second portion positioned in the channel for moving the power supply chassis from a docking position to a docked position when the handle is moved from the first position to the second position; and an extraction member engaging the positioning member for moving the power supply chassis from the docked position to the docking position when the handle is moved from the second position to the first position.

11. The computer system of claim 10 wherein the first portion of the handle includes a receptacle for receiving the positioning member.

12. The computer system of claim 10 wherein the extraction member is attached to the handle.

13. The computer system of claim 10 wherein the power supply chassis is displaced along an axis extending generally perpendicular to an end wall of the main chassis when the handle is displaced from the first position toward the second position, the end wall extending in a direction generally perpendicular to the top portion.

14. The computer system of claim 10 wherein the second portion of the handle includes a protruding member extending from the handle.

15. The computer system of claim 10 wherein the handle includes a plug passage extending therethrough and wherein the power supply chassis includes a plug connector mounted therein.

16. The computer system of claim 15 wherein the plug passage is generally aligned with the plug connector passage when the system component is in the docked a position.

17. The computer system of claim 10 wherein the handle includes a latch portion for securing the handle in the second position, the latch portion releasably engaging a catch portion of the main chassis when the handle is moved to the second position.

18. The computer system of claim 10 wherein the main chassis includes a base wall, a first flange extending from the base wall in a direction generally perpendicular to the base wall and a second flange extending from the end wall in a direction generally perpendicular to the end wall, and wherein the handle includes a plurality of concentric semi-cylindrical bearing portions, a first one of the bearing portions being seated in a channel defined by the base wall, the end wall and the first flange, and a second one of the bearing portions engaged against the second flange.

19. A computer chassis system, comprising:

a main chassis;

a a system component chassis removably mounted in the main chassis through an opening in a top portion thereof;

a handle pivotally attached to the main chassis for being moved between a first position and a second position;

means for positioning the system component chassis in a docking position with respect to the main chassis when the system component chassis is mounted in the main chassis with the handle in the first position;

means for moving the system component chassis from the docking position to a docked position with respect to the main chassis when the handle is moved from the first position to the second position; and means for moving the system component chassis from the docked position to the docking position when the handle is moved from the second position to the first position.

20. A method of docking a system component chassis in a main chassis of a computer, comprising the steps of:

attaching a positioning member to a system component chassis;

pivotally attaching a handle to a main chassis adjacent to an end wall thereof for being moved between a first position and a second position, mounting the system component chassis in the main chassis through an opening in a top portion thereof with the handle in the first position;

engaging the positioning member with a receptacle in the handle to position the system component chassis in a docking position with respect to the main chassis; and engaging an insertion member with the system component chassis to move the system component chassis from the docking position to a docked position with respect to the main chassis when the handle is moved from the first position to the second position.

\* \* \* \* \*